(12) United States Patent
Fucsko et al.

(10) Patent No.: US 7,709,341 B2
(45) Date of Patent: May 4, 2010

(54) METHODS OF SHAPING VERTICAL SINGLE CRYSTAL SILICON WALLS AND RESULTING STRUCTURES

(75) Inventors: Janos Fucsko, Boise, ID (US); David H. Wells, Boise, ID (US); Patrick Flynn, Boise, ID (US); Whonchee Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/445,544

(22) Filed: Jun. 2, 2006

(65) Prior Publication Data

US 2007/0281493 A1 Dec. 6, 2007

(51) Int. Cl.
*H01L 21/20* (2006.01)
(52) U.S. Cl. .................. 438/389; 438/746; 438/747; 257/E21.216; 257/E21.235; 257/E29.346
(58) Field of Classification Search .............. 438/389, 438/746, 747; 257/E21.216, E21.235, E29.346
See application file for complete search history.

(56) References Cited

U.S. PATENT DOCUMENTS

| | | | |
|---|---|---|---|
| 4,531,282 A | 7/1985 | Sakai et al. | |
| 4,891,255 A | 1/1990 | Ciarlo | |
| 5,427,975 A * | 6/1995 | Sparks et al. | 438/52 |
| 5,536,675 A | 7/1996 | Bohr | |
| 6,100,162 A | 8/2000 | Doan et al. | |
| 6,245,615 B1 | 6/2001 | Noble et al. | |
| 6,290,863 B1 | 9/2001 | Morgan et al. | |
| 6,319,333 B1 | 11/2001 | Noble | |
| 6,339,241 B1 | 1/2002 | Mandelman et al. | |
| 6,358,861 B1 * | 3/2002 | Ohji et al. | 438/746 |
| 6,391,793 B2 | 5/2002 | Lee et al. | |
| 6,465,865 B1 | 10/2002 | Gonzalez | |
| 6,518,112 B2 | 2/2003 | Armacost et al. | |
| 6,602,745 B2 | 8/2003 | Thwaite et al. | |
| 6,660,180 B2 | 12/2003 | Lee et al. | |
| 6,686,214 B2 | 2/2004 | Antaki et al. | |
| 6,713,341 B2 | 3/2004 | Chen et al. | |
| 6,784,076 B2 | 8/2004 | Gonzalez et al. | |
| 6,808,994 B1 | 10/2004 | Wang | |
| 6,858,903 B2 | 2/2005 | Natzle et al. | |
| 6,881,622 B2 | 4/2005 | Yu et al. | |
| 6,902,962 B2 | 6/2005 | Yeo et al. | |
| 6,909,147 B2 | 6/2005 | Aller et al. | |
| 6,927,104 B2 | 8/2005 | Lee et al. | |
| 6,960,507 B2 | 11/2005 | Kim et al. | |
| 6,960,821 B2 | 11/2005 | Noble et al. | |
| 6,963,114 B2 | 11/2005 | Lin | |

(Continued)

OTHER PUBLICATIONS

International Search Report dated Nov. 26, 2007, for International Application No. PCT/US2007/012904 (3 pages).

(Continued)

*Primary Examiner*—Fernando L Toledo
(74) *Attorney, Agent, or Firm*—TraskBritt

(57) ABSTRACT

A single crystal silicon etching method includes providing a single crystal silicon substrate having at least one trench therein. The single crystal silicon substrate is exposed to an anisotropic etchant that undercuts the single crystal silicon. By controlling the length of the etch, single crystal silicon islands or smooth vertical walls in the single crystal silicon may be created.

35 Claims, 11 Drawing Sheets

U.S. PATENT DOCUMENTS

| | | | |
|---|---|---|---|
| 6,964,903 | B2 | 11/2005 | Forbes et al. |
| 6,968,110 | B2 | 11/2005 | Patel et al. |
| 7,045,407 | B2 * | 5/2006 | Keating et al. ............... 438/198 |
| 2002/0001968 | A1 | 1/2002 | Lee et al. |
| 2002/0025636 | A1 | 2/2002 | Ju |
| 2003/0003759 | A1 | 1/2003 | Kudelka |
| 2003/0022505 | A1 | 1/2003 | Ouellet et al. |
| 2003/0057438 | A1 | 3/2003 | Yu et al. |
| 2004/0014280 | A1 | 1/2004 | Willer et al. |
| 2004/0038533 | A1 | 2/2004 | Liang |
| 2004/0067346 | A1 | 4/2004 | Hofmann et al. |
| 2004/0118805 | A1 | 6/2004 | Hareland et al. |
| 2004/0214436 | A1 | 10/2004 | Dow |
| 2005/0020091 | A1 | 1/2005 | Fucsko et al. |
| 2005/0208727 | A1 | 9/2005 | Lin et al. |
| 2007/0173007 | A1 | 7/2007 | Lee et al. |

OTHER PUBLICATIONS

Bassous, Ernest, "Fabrication of Novel Three-Dimensional Microstructures by the Anisoptropic Etching of (100) and (110) Silicon," IEEE Transactions on Electron Devices, Oct. 1978, pp. 1178-1185, vol. 25, No. 10.

Bean, Kenneth E., "Anisotropic Etching of Silicon," IEEE Transactions on Electron Devices, Oct. 1978, pp. 1185-1193, vol. 25, No. 10.

Chu et al., "A Novel Convex Corner Compensation for Wet Anisotropic Etching on (100) Silicon Wafer," Date Unknown, pp. 253-256.

Fried et al., "Improved Independent Gate N-Type FinFET Fabrication and Characterization," IEEE Electron Device Letters, Sep. 2003, pp. 592-594, vol. 24, No. 9.

Huang et al., "Sub-50nm P-Channel FinFET," IEEE Transactions on Electron Devices, May 2001, pp. 880-886, vol. 58, No. 5.

Jackson et al., "An Electrochemical P-N Junction Etch-Stop for the Formation of Silicon Microstructures," IEEE Electron Device Letters, Feb. 1981, vol. EDL-2, No. 2.

Kim et al., "Advance Integration Technology for a Highly Scalable SOI DRAM with SOC (Silicon-On-Capacitors)," IEDM, 1996, pp. 605-608, vol. 96.

Lee et al., "Novel Body Tied FinFET Cell Array Transistor DRAM with Negative Word Line Operation for sub 60nm Technology and Beyond," 2004 Symposium on VLSI Technology Digest of Technical Papers, pp. 130-131.

Lee et al., "A Novel Pattern Transfer Process for Bonded SOI Giga-bit DRAMS," Proceedings 1996 IEEE International SOI Conference, Oct. 1996, pp. 114-115.

Lee et al., "The Surface /Bulk Micromachining (SBM) Process: A New Method for Fabricating Released MEMS in Single Crystal Silicon," Dec. 1999, vol. 8, No. 4.

Pandhumsoporn et al., "High Etch Rate, Deep Anistropic Plasma Etching of Silicon for MEMS Fabrication," Date Unknowm, pp. 1-9.

Wagner, Andrew, "KOH Si Wet Etch Review," Date Unknown, pp. 1-14.

Yeo, et al., "80 nm 512M DRAM with Enhanced Data Retention Time Using Partially-Insulated Cell Array Transistor (PiCAT)," 2004 Symposium on VLSI Technology Digest of Technical Papers, pp. 30-31.

Yeo et al., Transistor test structures for leakage current analysis of partial SOI,: Date Unknown, 2 pages.

Sato et al., Development of an Orientation-Dependent Anisotropic Etching Simulation System MICROCAD, Electronics and Communications in Japan, Part 2, vol. 83, No. 4, 2000, pp. 13-22.

E. Chen, Applied Physics 298r on Mask Orientation, Apr. 12, 2004.

* cited by examiner

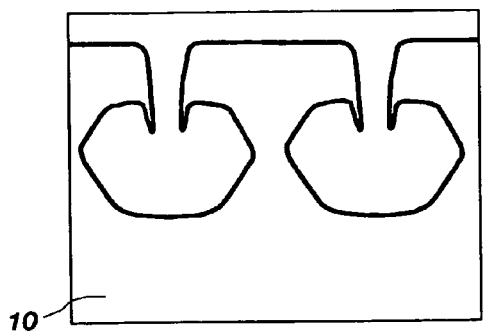
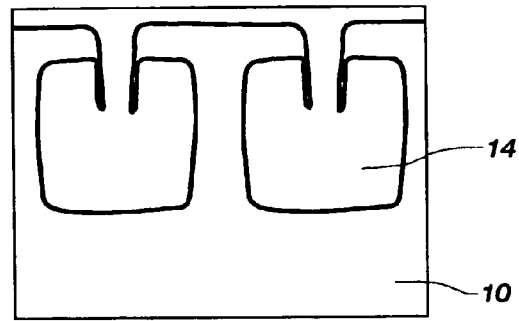
FIG. 5A        FIG. 5B

US 7,709,341 B2

METHODS OF SHAPING VERTICAL SINGLE CRYSTAL SILICON WALLS AND RESULTING STRUCTURES

The present application is related to U.S. patent application Ser. No. 11/445,911, filed Jun. 2, 2006, now U.S. Pat. No. 7,625,776, issued Dec. 1, 2009, entitled METHOD OF FABRICATING INTERMEDIATE SEMICONDUCTOR STRUCTURES BY SELECTIVELY ETCHING POCKETS OF IMPLANTED SILICON AND INTERMEDIATE SEMICONDUCTOR STRUCTURES FORMED FROM SAME and U.S. patent application Ser. No. 11/445,718, filed Jun. 2, 2006, now U.S. Pat. No. 7,628,932, issued Dec. 8, 2009, entitled WET ETCH SUITABLE FOR CREATING SQUARE CUTS IN SI, each assigned to the Assignee of the present application, the disclosure of each of which is incorporated by reference herein in its entirety.

BACKGROUND OF THE INVENTION

1. Field of the Invention

The present invention relates generally to methods for undercutting single crystal silicon using wet etchants. More particularly, the present invention relates to methods of forming smooth vertical single crystal silicon walls and single crystal silicon islands.

2. State of the Art

Higher performance, lower cost, increased miniaturization of semiconductor components, and greater packaging density of integrated circuits are ongoing goals of the computer industry. One way to reduce the overall cost of a semiconductor component is to reduce the manufacturing cost of that component. Lower manufacturing costs can be achieved through faster production as well as in reduction in the amount of materials used in fabricating the semiconductor component. In recent years, the semiconductor industry has greatly expanded its emphasis in development and production of electro-optical components, such as, for example, charge-coupled devices (CCDs) and, more recently, CMOS imagers. As with other semiconductor components, there is a continued drive toward higher performance parameters and greater yields at ever-lower costs.

Micro-electromechanical systems ("MEMS") is another technology receiving a great deal of attention in many industries, including the electronics industry. MEMS integrate microminiature electrical and mechanical components on the same substrate, for example, a silicon substrate, using microfabrication technologies to form extremely small apparatuses. The electrical components may be fabricated using integrated circuit fabrication ("IC") processes, while the mechanical components may be fabricated using micromachining processes that are compatible with the integrated circuit fabrication processes. This combination of approaches makes it possible, in many instances, to fabricate an entire microminiature system on a chip using conventional manufacturing processes. However, there remain many shortcomings in existing fabrication technologies that limit the types and sizes of MEMS components and assemblies that may be fabricated.

Various conventional chemistries have been used to etch silicon. For example, both single crystal and polycrystalline silicon are typically wet etched in mixtures of nitric acid ($HNO_3$) and hydrofluoric acid (HF). With use of such etchants, the etching is generally isotropic. The reaction is initiated by the $HNO_3$, which forms a layer of silicon dioxide on the silicon, and the HF dissolves the silicon oxide away. In some cases, water is used to dilute the etchant, with acetic acid ($CH_3COOH$) being a preferred buffering agent.

Currently, the industry builds many devices on silicon-on-insulator material. However, limitations exist in fabricating isolated crystal silicon overlying oxide. Further, many reduced area devices, such as FinFETs, use vertical silicon surfaces in transistors. However, traditional dry etch processes create relatively rough surfaces, which is an undesirable characteristic. Thus, it would be desirable to identify a method of creating vertical silicon walls having smooth surfaces and also single crystal silicon islands in or on top of insulator materials.

BRIEF DESCRIPTION OF THE SEVERAL VIEWS OF THE DRAWINGS

In the drawings, which illustrate what is currently considered to be the best mode for carrying out the invention:

FIG. 5A is a cross-sectional view of single crystal silicon masked along the <110> direction and undercut with a buffered fluoride etch solution of the present invention applied at 26° C. FIG. 5B shows single crystal silicon masked along the <100> direction and undercut with a buffered fluoride etch solution of the present invention applied at 26° C.

FIGS. 6A-13D show a single crystal silicon wafer at various stages in a fabrication process according to one embodiment of the present invention. FIG. 6A is a plan view of a single crystal silicon wafer according to an embodiment of the present invention.

FIG. 13D is a cross-sectional view of the single crystal silicon wafer of FIG. 13A taken along line 13D-13D of FIG. 13A.

DETAILED DESCRIPTION OF THE INVENTION

Figure 1A:
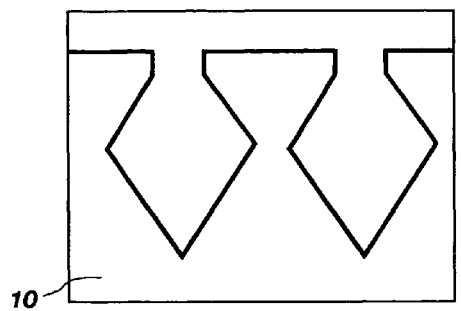
FIG. 1A is a cross-sectional view of single crystal silicon masked along the <110> direction and undercut with $NH_4OH$ applied at 26° C.

In the following detailed description of the invention, reference is made to the accompanying drawings, which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms "wafer" and "substrate" as used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to those of ordinary skill in the art. The term "conductor" is understood to include semiconductors, and the term "insulator" is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over" and "under," are defined with respect to the conventional plane or surface being on the top surface of the wafer or substrate, regardless of the orientation of the wafer or substrate.

Etch compositions for oxidizing silicon and etching silicon dioxide to create desired structures according to the present invention shall be generally described below. With the description as provided below, it will be readily apparent to one skilled in the art that the anisotropic etch compositions described herein may be used in various applications. In other words, the etch compositions may be used whenever silicon etch is being performed and wherein smooth vertical silicon walls or isolated silicon islands are desired. For example, the present invention may be used in the formation of isolation structures for use in the fabrication of integrated circuits. Further, for example, the present invention may be beneficial in the fabrication of transistor structures, such as pseudo-silicon-on-insulator devices (including DRAM, SRAM, Flash, imagers, PCRAM, MRAM, CAM, etc.), FinFETs, surround gate transistors, as well as MEMS and electro-optical components.

There is a need in the industry, as recognized by the inventors herein, to create vertical walls and single crystal silicon structures in (100) silicon using wet etch chemistry. The wet etch chemistry of the present invention may be used to fabricate devices that have previously been prohibitively expensive, complicated and/or poor yielding.

Using appropriate pattern angles and appropriate hydroxide or hydroxide- and fluoride-based etch solutions, vertical wall devices may be manufactured according to an embodiment of the invention. The process may utilize silicon having conventional shallow trench isolation (STI) structures therein. The substrate is exposed to a wet anisotropic etchant that undercuts the silicon to create a smooth vertical silicon wall. Exemplary etchant solutions include, but are not limited to, buffered oxide etchant ("BOE") dilute TMAH, TMAH with FX (where "X" is a cation), TMAH with $NH_4F$, $NH_4OH$, and $NH_4OH$ with $NH_4F$. Use of a buffered fluoride etch solution is also encompassed by the present invention. The resulting structures formed in accordance with the present invention may be incorporated into reduced-area devices, including FinFET and other vertically structured transistors.

Similarly, isolated single crystal silicon islands may be formed by, generally, undercutting silicon using etchants of the present invention, potential trench fill (e.g., spin-on dielectric or "SOD") and oxidation of the remaining supporting silicon walls. When creating isolated single crystal silicon islands, the etch may be allowed to progress longer than when creating vertical silicon walls such that the underlying "silicon leg" is too narrow for further processing to create a FIN structure. This method provides an inexpensive alternative to prefabricated silicon-on-insulator substrates that are commercially available. One benefit of the isolated single crystal silicon islands of the present invention is that device performance should not be significantly affected by leaking through the silicon material thereunder because of the oxide underlying the isolated single crystal silicon islands.

Exemplary etch solutions include hydroxide and hydroxide and fluoride solutions. Exemplary etchants include BOE (i.e., a mixture of a $NH_4F$ aqueous solution (40% concentrated) and an aqueous solution of HF (49% concentrated)), tetramethylammonium hydroxide (TMAH), TMAH with FX (where "X" is a cation), TMAH with NH$_4$F, NH$_4$OH, and NH$_4$OH with NH$_4$F.

In an embodiment wherein TMAH with FX (where "X" is a cation) is selected as the etchant, the pH may be greater than 11, more preferably between pH 12 and pH 13.5. As a non-limiting example, a solution including 25% TMAH may be used with a 40% solution of NH$_4$F in a ratio between about 4:1 to about 8:1 TMAH:NH$_4$F from 9-10 pH to pH 14.5. The TMAH and NH$_4$F solution may be applied to the silicon at a temperature range between 10-100° C., more preferably, 25° C. to 95° C. For other etch solutions, the etching process may be performed at a temperature in the range of about 10° C. to about 70° C. Preferably, the etching process occurs at a temperature between 20° C. to about 30° C. and, more preferably, between about 20° C. and 25° C.

Generally, any known method may be used to expose the single crystal silicon to the selected etchant. For example, the silicon may be immersed into a tank of the etch solution. The solution may also be sprayed onto the wafers being etched or may be introduced for contact with the wafer in any other manner, e.g., drip, spraying, vapor, etc.

Figure 1B:
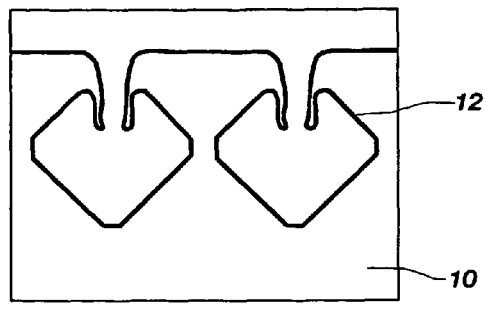
FIG. 1B shows single crystal silicon masked along the <100> direction and undercut with $NH_4OH$ applied at 26° C.
Figure 2A:
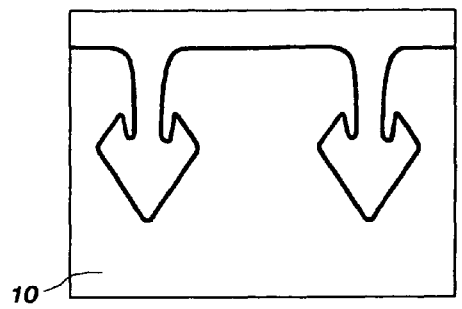
FIG. 2A is a cross-sectional view of single crystal silicon masked along the <110> direction and undercut with dilute tetramethylammonium hydroxide (TMAH) applied at 26° C.
Figure 2B:
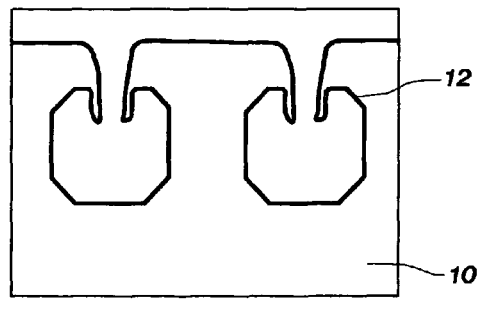
FIG. 2B shows single crystal silicon masked along the <100> direction and undercut with dilute TMAH applied at 26° C.

FIGS. 1A, 1B, 2A, and 2B show a masked single crystal silicon etch performed with different etchant solutions in both the standard silicon orientation (FIG. 1A and FIG. 2A) and 45° rotation of the same mask (FIG. 1B and FIG. 2B). In the standard orientation, a mask is aligned along the <110> directions. The {111} planes define the sidewalls, which are sloped from the (100) surface plane. With the 45° rotation, the mask is aligned along the <100> direction and etching is slower in the <110> direction. In FIG. 1, the etchant was dilute NH$_4$OH applied at 26° C. and in FIG. 2, the etchant was dilute TMAH applied at 26° C. While the two etchants display different selectivity, both undercut the single crystal silicon 10 and create beveled edges or chamfers 12. While the beveled edges may be undesirable for some applications, such structures are suitable for further processing to create vertical silicon walls and single crystal silicon islands as further discussed herein.

The etch rate of hydroxide-based etch solutions, i.e., NH$_4$OH or TMAH, is highly selective to crystal orientation, and the chemical reaction mechanism may be depicted as follows:

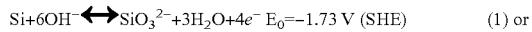  (1) or

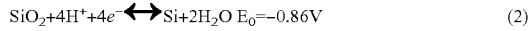  (2)

  (3)

  (4)

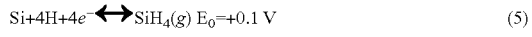  (5)

Using appropriate pattern angles in combination with hydroxide or hydroxide and fluoride etch solutions, vertical wall devices may be manufactured having various profiles. It will be appreciated that in some applications, the top portion, or "table top," of the silicon will be desirable, while in other applications, the profile underneath the silicon will be desirable. Referring to FIGS. 3A-3D, regular-shaped isolated single crystal silicon islands may be formed using a wet etch undercut, potential trench fill (e.g., SOD) and oxidation of the remaining supporting silicon walls. Similarly, referring to FIGS. 4A-4D, using a conventional STI trench as a starting point, vertical silicon walls may be fabricated for devices like FinFETs. Generally, the silicon active area is undercut to provide better access device isolation. The real estate is improved between the active area and STI structure, resulting in better isolation with the same upper trench width. An ideal etch would provide a horizontal "table top" for transistors and smooth vertical post structure, which has proven difficult using known methods.

Figure 3A:
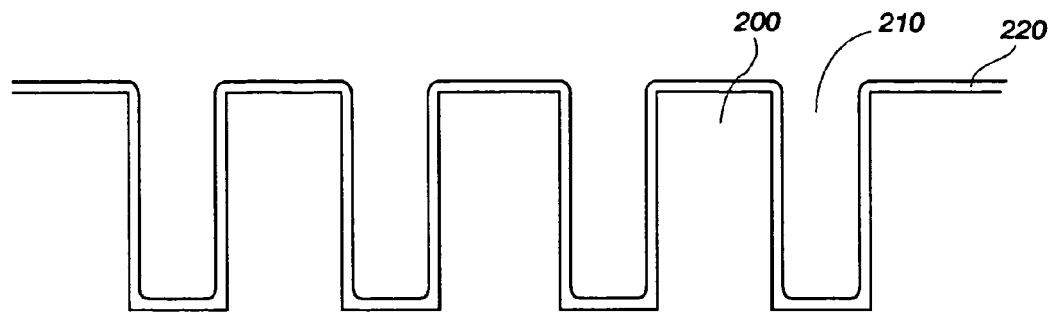
FIGS. 3A-3D depict the formation of isolated single crystal silicon islands according to an embodiment of the present invention.
Figure 3B:
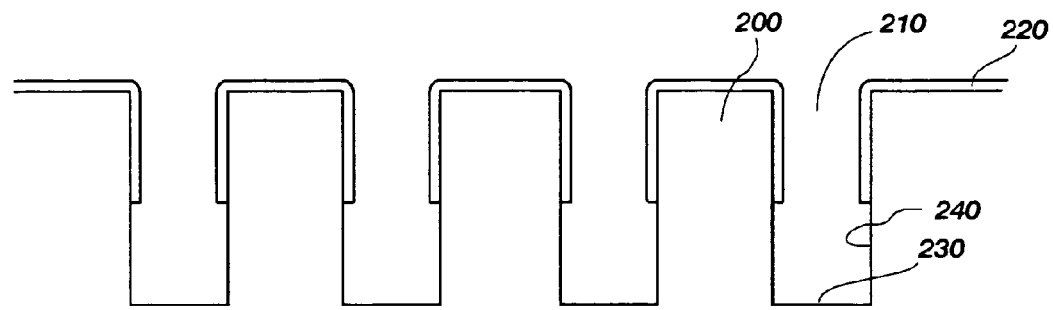
Figure 3C:
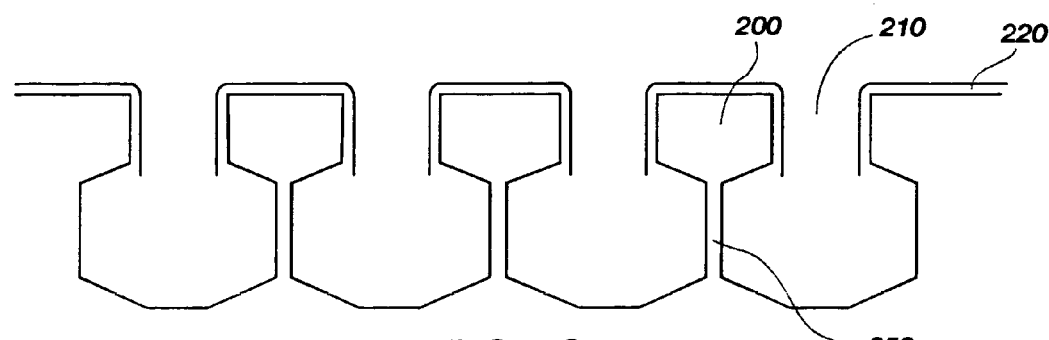

Using a conventional STI trench 210 as a starting point, a silicon nitride liner 220 may be deposited over the surface of the single crystal silicon 200 and trenches 210 as shown in FIG. 3A. A dry etch may remove the silicon nitride liner 220 from the bottom surface 230 of the trenches 210 and may partially remove the silicon nitride from the sidewalls 240 of trenches 210 as shown in FIG. 3B. The etch may be conducted utilizing a dry anisotropic etching chemistry, with or without plasma, for example, comprising ammonia and at least one fluorocarbon. A wet etch using TMAH may be performed for approximately 5 minutes at 26° C. to undercut the single crystal silicon 200. 100:1 deionized water:TMAH exhibits an etch rate in (100) silicon of approximately 6 Å/second. As shown in FIG. 3C, this process creates "silicon legs" 250, which may be removed by later processing.

It will be understood that the etchant is not limited to TMAH, but also includes, but is not limited to, BOE, TMAH with FX (where "X" is a cation), TMAH with NH$_4$F, NH$_4$OH, and NH$_4$OH with NH$_4$F. Such solutions may be applied alone or in combination with a buffered fluoride etch solution. When creating isolated silicon islands, the etch may be allowed to progress up to 30 minutes or longer, depending on etch rate and initial dimensions such as distance of trenches and trench depth, to narrow the width of the silicon legs 250. This is especially effective when the etchant etches faster in a direction parallel to the top surface of the silicon. If a hydroxide is selected as the etchant, oxide spacers, rather than nitride spacers, may be used.

Figure 3D:
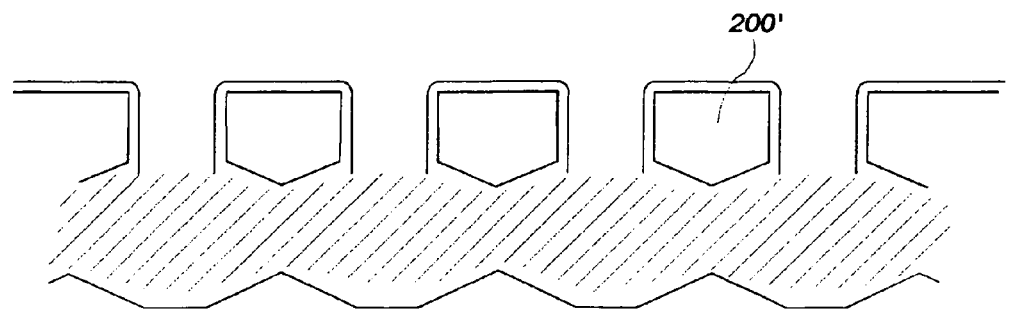

An SOD fill and oxidation/steam densification may then be performed, which removes the silicon legs (or pillars) 250 and creates horizontal isolated silicon island structures 200' as shown in FIG. 3D. The isolated silicon island structures 200' may then be subject to further processing and incorporated into any desired component including, without limitation, transistors, capacitors, flash devices, DRAM or FLASH memories.

Conventionally, isolated silicon island structures are created by extending a spacer the entire length of the trench sidewall followed by oxidation of the entire structure. This process creates a significant stress that may lead to leakage. By only oxidizing the silicon legs 250 in the present invention, the single crystal silicon 200 above remains high quality and unstressed. Thus, one advantage of the isolated silicon island structures 200' of the present invention is that device performance would not be significantly affected by leakage through the silicon material thereunder.

Figure 4A:
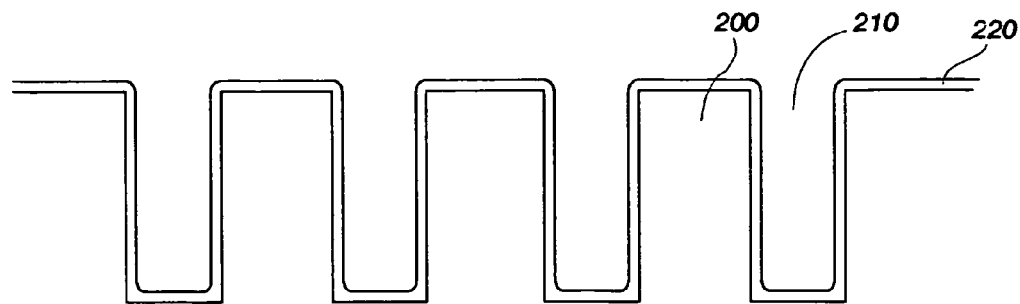
FIGS. 4A-4D depict the formation of vertical crystal silicon walls according to an embodiment of the present invention.
Figure 4B:
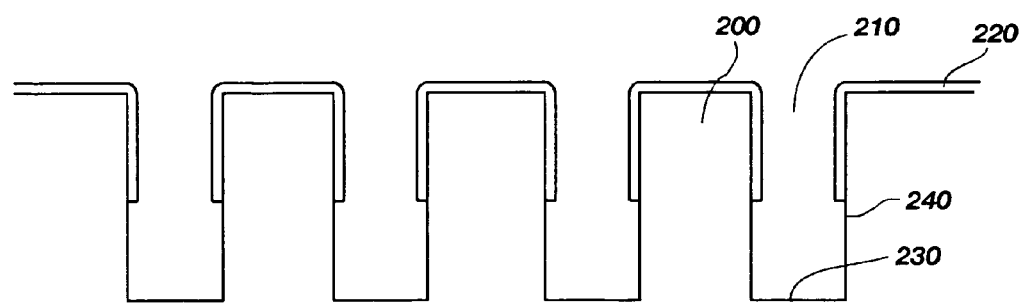

A continued goal of FinFET fabrication is to narrow the dimension of the Fins. If the Fin is thin enough, when a gate is turned on a transistor, it may be possible to completely deplete that portion of the FinFET, providing the user with complete control of the transistor. A method of forming Fins according to the present invention is shown in FIGS. 4A-4D. Starting with a conventional STI trench 210 in single crystal silicon 200, a silicon nitride liner 220 may be deposited over the surface of the single crystal silicon 200 and trench 210 as shown in FIG. 4A. A dry etch may remove the silicon nitride liner 220 from the bottom surface 230 of the trenches 210 and may partially remove the silicon nitride from the sidewalls 240 of trench 210 as shown in FIG. 4B. The etch may be conducted utilizing a dry anisotropic etching chemistry, with or without plasma, for example, comprising ammonia and at least one fluorocarbon. A pattern is aligned along the <100> direction and a wet etch with TMAH for approximately 4 minutes at 26° C. may be performed to undercut the silicon.

When creating vertical silicon walls, the etch time may typically be shorter than when creating single crystal silicon islands as described with respect to FIGS. 3A-3D. When the etch proceeds too long, the trench and spacer may be too deep for narrow FIN structures. It will be understood that the etchant is not limited to TMAH, but also includes, but is not limited to, the buffered fluoride etch solution of the present invention, BOE, TMAH with FX (where "X" is a cation), TMAH with $NH_4F$, $NH_4OH$, and $NH_4OH$ with $NH_4F$. Further, a buffered fluoride etch solution is encompassed by the present invention. Comparing FIGS. 1A, 1B, 2A, and 2B, the etch selectivity of TMAH is shown to be particularly suited for creation of vertical walls, with trench lines that are 45° angles to the vertical (notch-strike) axis on a <100> silicon wafer, while the etch selectivity of $NH_4OH$ is shown to be particularly well suited for creation of isolated silicon islands with an angled sidewall and deeper silicon undercut. If a hydroxide is selected as the etchant, oxide spacers, rather than nitride spacers, may be used. The $NH_4OH$ progresses to a diamond shape faster than TMAH because of the higher selectivity of $NH_4OH$ to (111) silicon as compared to (100) and (110) silicon. The choice of etchant may depend upon the desired final shape and controllability.

Figure 4C:
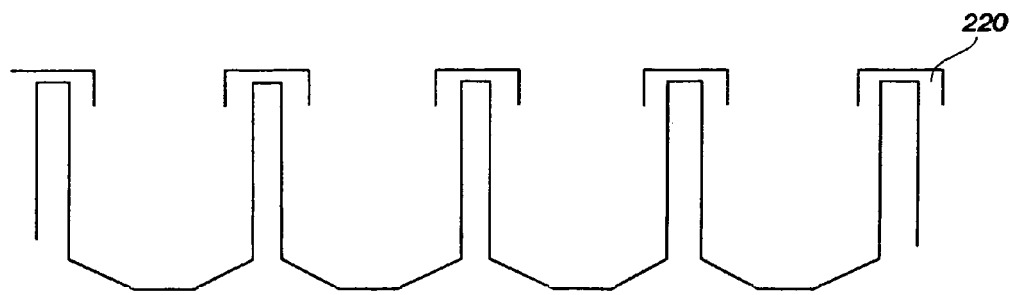
Figure 4D:
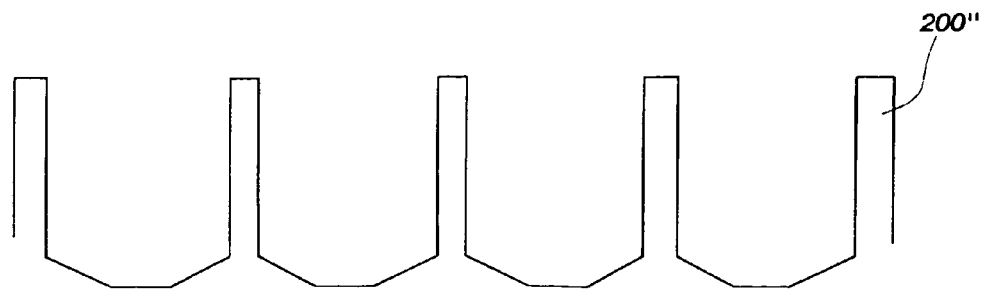

A wet nitride strip may be performed to create isolated vertical structures, or Fins, 200" as shown in FIG. 4C. The isolated vertical structures, or Fins, 200" may be subjected to further processing as desired. Creation and removal of the silicon nitride liner 220 may be performed by conventional techniques, as shown in FIG. 4D. Oxide spacers may be used instead of the silicon nitride liner and 220 may be formed by TEOS deposition or $SiO_2$ growth as known in the art. The oxide spacers may be removed by conventional techniques, such as dilute HF.

Figure 16A:
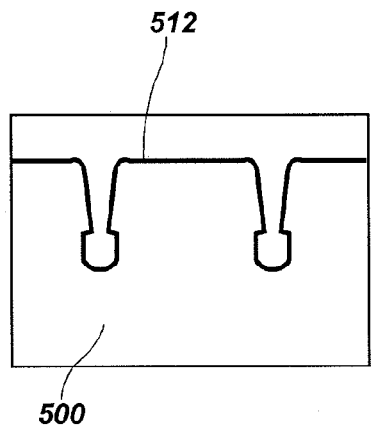
FIGS. 16A-16C depict a time progression for a TMAH etch of (100) silicon.
Figure 16B:
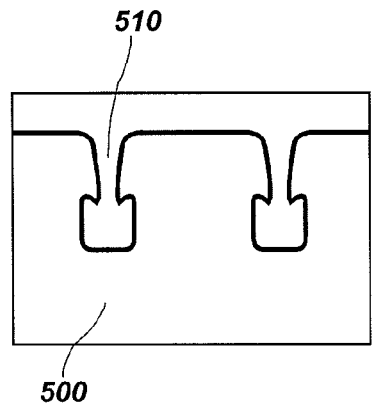
Figure 16C:
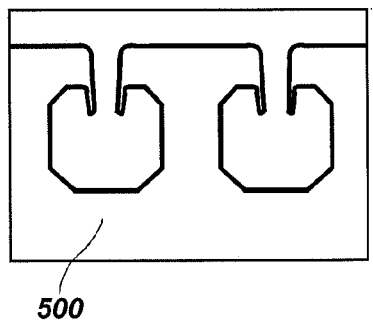
Figure 16D:
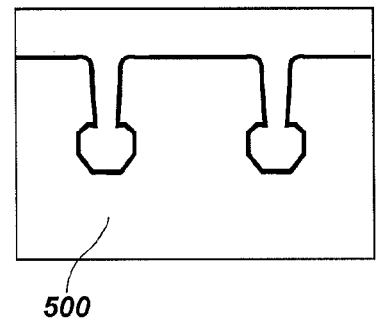
FIGS. 16D-16F depict a time progression of an $NH_4OH$ etch of (100) silicon.
Figure 16E:
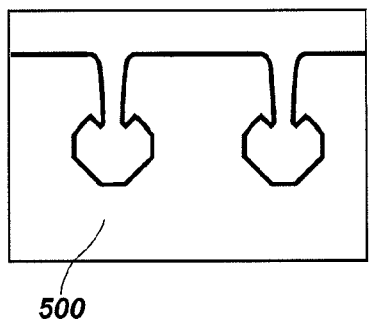
Figure 16F:
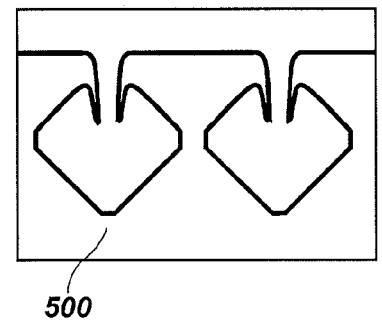

FIGS. 16A-16F depict a time progression for both TMAH (FIGS. 16A-16C) and $NH_4OH$ (FIGS. 16D-16F). The top surface 512 of the single crystal silicon 500 represents the (100) plane. The trench 510 is <110> on the (100) plane. Both etches were performed by immersing (100) silicon in an etchant at 26° C. The $NH_4OH$ etch was performed using 0.3% $NH_4OH$ and the TMAH etch was performed using 0.23% TMAH. FIGS. 16A and 16D depict the etch after 1 minute has elapsed. FIGS. 16B and 16E depict the etch after 2 minutes have elapsed. FIGS. 16C and 16F depict the etch after 4 minutes have elapsed. The initial shape created is dependent on the selectivity ratio of the silicon plane. A TMAH etch may achieve the diamond shape shown in FIG. 16F, however, the etch proceeds at a slower rate. TMAH allows for more controlled shelf progression. A sequential etch may be performed to customize the desired final shape of the silicon shelf.

By combining the processes of FIGS. 3A-3D and 4A-4D in one process flow by different spacing between lines and/or different spacer depth, Fins, silicon "table tops" supported by narrow Fins and isolated silicon structures may be fabricated at the same time on the same wafer. For example, using a conventional STI trench as a starting point, a silicon nitride liner 220 may be deposited over the surface of the single crystal silicon 200 and trenches 210 as shown in FIG. 3A. A dry etch may remove the silicon nitride liner 220 from the bottom surface 230 of the trenches 210 and may partially remove the silicon nitride from the sidewalls 240 of trenches 210 as shown in FIG. 3B. A wet etch using, for example, TMAH, may be applied to the entire wafer.

The portion of the wafer to include vertical silicon walls may be allowed to proceed with the wet etch for approximately 4 minutes at 26° C. and a wet nitride strip may be performed on that portion of the wafer to create isolated vertical structures, or Fins, 200", as shown in FIG. 4D. The portion of the wafer to include single crystal silicon islands may be allowed to proceed with the wet etch for a longer period of time, for example, 5-30 minutes at 26° C. to create "silicon legs" 250 as shown in FIG. 3C. An SOD fill and oxidation/steam densification may then be performed that removes the silicon legs (or pillars) 250 and creates horizontal isolated silicon island structures 200' as shown in FIG. 3D.

Figure 17A:
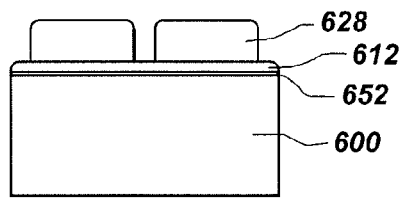
FIGS. 17A-17I show a method of creating a partial SOI ("PSOI") DRAM access transistor structure according to an embodiment of the present invention.
Figure 17B:
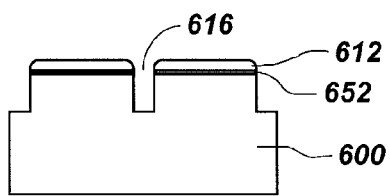

As a non-limiting example, FIGS. 17A-17I depict a method of forming a PSOI structure on (100) silicon 600 according to one embodiment of the present invention. In FIG. 17A, a resist 628 is patterned for the PSOI structure over a hardmask of 500 Å $SiN_4$ 612, 95 Å $SiO_2$ 652. The pattern is dry etched using conventional methods to a desired depth into the silicon 600 followed by conventional wafer cleanup to form at least one trench 616 (FIG. 17B). The initial dry etch sets the spacer depth 662 (FIG. 17D), which may be selected based upon the selectivity and etch rate of the anticipated wet etch. The width of the initial opening may influence the etch and depth of a dry etch.

Figure 17C:
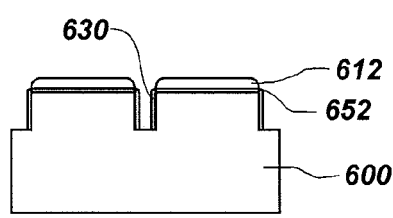
Figure 17D:
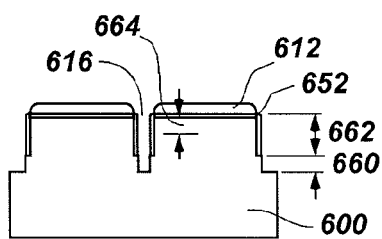
Figure 17E:
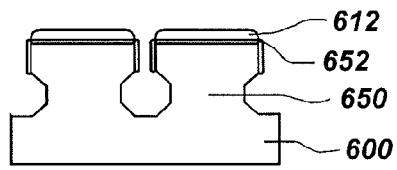
Figure 17F:
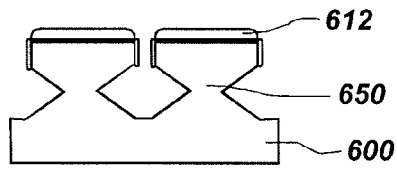

A thin layer of $SiO_2$ 652 may be grown by dry oxidation of silicon 600, deposition of approximately 100 Å TEOS $SiO_2$ followed with an oxide spacer etch to create spacers on the sidewalls 630 of trench 616 (FIG. 17C). A subsequent silicon etch is performed within trench 616 to open the desired silicon planes prior to wet etch. The spacer depth 662 correlates to the size of the final shelf of Si 672 (FIGS. 17D and 17I).

A wet etchant may be selected based on the desired cavity shape and shape of the final shelf 672. Using (100) silicon, $NH_4OH$ will progress to a diamond shape faster than TMAH. The speed at which an etchant attacks the corners is selectivity dependent. Thus, the choice of etchant may also influence the size of the final shelf 672. FIG. 17E depicts an $NH_4OH$ etch after 2 minutes. FIG. 17F depicts the $NH_4OH$ etch after 4 minutes. As the hydroxide etch rate progresses, the slowest etch planes (111) merge to point 650. The distance to merge is set by the post-spacer etch 660 depth 660 while the final ledge thickness is shown at 664.

Figure 17G:
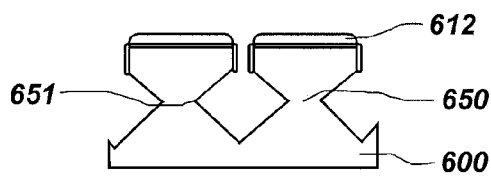
Figure 17H:
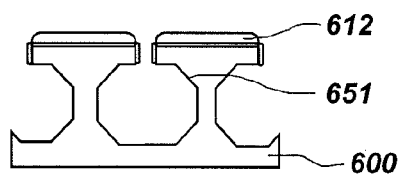
Figure 17I:
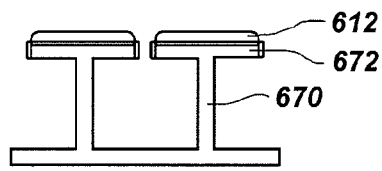

As shown in FIG. 17G, the hydroxide etch rate undercut slows in a <100> direction with further hydroxide cut after the slow planes meet at point 650. This may occur with a hydroxide etch after approximately 8 minutes in the example depicted in FIGS. 17A-17I. When the planes start to meet, the process may be essentially self-limiting and the etch profile may stop. At this point, a second etchant with different selectivity may be selected to etch, for example, the corners 651. In FIG. 17H, a buffered fluoride etch solution (a volumetric ratio of $NH_4F:QEII:H_2O_2$ of about 4:2:3) etches (111) silicon faster than (100) silicon. Thus, the undercut profile becomes more square which may be desirable for some structures including, for example, a PSOI structure. The profile shown in FIG. 17H correlates to the TEM depicted in FIG. 18. If the buffered fluoride etch solution is allowed to progress, the profile may continue to become more square with a slow change of the stem 670 and shelf 672 thickness in the example depicted in FIGS. 17A-17I. (FIG. 17I). Thus, by maximizing the very tight controllability of the dry etch and the uniformity of the wet etch, the shape and size of the final product may be achieved.

The invention may further be understood by the following non-limiting examples.

Example 1

A single crystal silicon wafer was etched with $NH_4F$ 40% volume in water for 5 minutes at 26° C. The $NH_4F$ undercut the silicon to create a structure suitable for further processing to create either vertical silicon walls or single crystal silicon islands.

Example 2

A single crystal silicon wafer was etched with HF and $NH_4F$ in isopropyl alcohol for 5 minutes at 26° C. The HF and $NH_4F$ undercut the silicon to create a structure suitable for further processing to create either vertical silicon walls or single crystal silicon islands.

Example 3

A single crystal silicon wafer was etched with QEII (HF/$H_3PO_4$:$NH_4F$) for 5 minutes at 26° C. The QEII undercut the silicon to create a structure suitable for further processing to create either vertical silicon walls or single crystal silicon islands.

Example 4

A single crystal silicon wafer was etched with 100:1 BOE and 150:1 BOE (HF:$NH_4F$) for 5 minutes at 26° C. The BOE undercut the silicon to create a structure suitable for further processing to create either vertical silicon walls or single crystal silicon islands.

Example 5

A single crystal silicon wafer was etched with 0.3% $NH_4OH$ for 4 minutes at 26° C. The silicon was patterned along the <100> direction. A second single crystal silicon wafer was etched with 0.23% TMAH for 4 minutes at 26° C. Both etchants undercut silicon; however, there was a significant difference between the etchant selectivity toward different crystal orientation. The $NH_4OH$ etched silicon faster than TMAH along the <100> direction. TMAH has a lower <100>:<110> etch ratio, which may result in better controlled etching.

Example 6

A single crystal silicon wafer was etched with $NH_4OH$ and $NH_4F$ for 5 minutes at 26° C. The $NH_4OH$ and $NH_4F$ undercut the silicon to create a structure suitable for further processing to create either vertical silicon walls or single crystal silicon islands.

Example 7

A single crystal silicon wafer was etched with TMAH and $NH_4F$ for 5 minutes at 26° C. The TMAH and $NH_4F$ undercut the silicon to create a structure suitable for further processing to create either vertical silicon walls or single crystal silicon islands.

The present invention also encompasses use of a buffered fluoride etch composition in undercutting single crystal silicon to form vertical structures or isolated silicon islands, the buffered etch solution generally including a fluoride component, an inorganic acid and an oxidizing agent. The buffered fluoride etch solution may be used alone or in combination with the hydroxide etchants disclosed herein. The fluoride component may be, without limitation, HF, $HF_2^-$, $NH_4F$, or TMAF. The ammonium fluoride may be formed with a mixture of ammonium hydroxide and HF. The fluoride component or solution is such that when the reaction of the etch composition with silicon forms silicon dioxide, the fluoride component or solution dissolves away the silicon dioxide formed thereby. The fluoride component may be present in the amount of 0.5-50% by weight.

The oxidizing agent of the buffered fluoride etch composition may be any oxidizing agent, such as hydrogen peroxide or ozone. Preferably, the oxidizing agent is hydrogen peroxide.

The inorganic acid component may include at least one acid selected from hydrofluoric acid (HF), phosphoric acid ($H_3PO_4$), sulfuric acid ($H_2SO_4$), nitric acid ($HNO_3$), hydrochloric acid (HCl), carbonic acid ($H_2CO_3$), or any other suitable inorganic acid. It is currently preferred that the inorganic acid is $H_3PO_4$. Inorganic acids are commercially available as concentrated solutions (X), which then typically are diluted to a desired concentration ($H_2O$:X). For example, commercially available concentrated acids are available as follows: HCl is 37% by weight in deionized water; $HNO_3$ is 70% by weight in deionized water; $H_2SO_4$ is 96% by weight in deionized water, and $H_3PO_4$ is 85% by weight in deionized water. Concentrations of etch compositions described herein are given based on commercially available solutions. For example, if the etch composition has a concentration of 30% HCl, then the solution includes 30% by weight of the commercially available HCl solution. Hydrogen peroxide ($H_2O_2$) is also commercially available as a concentrated solution of approximately 29% by weight in deionized water. Further, ammonium fluoride is also commercially available as a concentrated solution of approximately 40% by weight in deionized water. Further, one will recognize that multiple components of the solution may be provided from commercially available solutions. For example, QEII available from Olin Microelectronics Materials (Norwalk, Conn.) provides both $NH_4F$ and an inorganic acid that may be used to adjust the pH of the solution.

Other exemplary suitable etchants are disclosed in U.S. patent application Ser. No. 625,166 and U.S. Pat. No. 6,391,793, the contents of each of which documents are incorporated herein by reference. The buffered fluoride etch solution preferably has a pH in the range of about 5.0 to about 9.0. More preferably, the buffered fluoride etch composition has a pH of about 7.8. Preferably, the buffered fluoride etch composition includes a fluoride component in a range of about 0.5% to about 50% by weight of the buffered fluoride etch composition, an oxidizing agent in the range of about 0.5% to about 30% by weight of the buffered fluoride etch composition, and an inorganic acid in the range of about 0.1-2% by weight. For example, the buffered fluoride etch composition may preferably include a volumetric ratio of $NH_4F$:QEII:$H_2O_2$ of about 4:2:3 (or approximately 10-35 w % $NH_4F$, approximately 3-20 w % $H_2O_2$, approximately 0.1-2 w % $H_3PO_4$ or other acid, and the remaining balance of deionized water).

Preferably, the ionic strength of the buffered fluoride etch composition is greater than one; more preferably, the ionic strength is in the range of about 5 to about 20. As used herein, ionic strength refers to a measure of the average electrostatic interaction among ions in the composition, which is equal to one-half the sum of the terms obtained by multiplying the molarity of each ion by its valence squared. Yet further, preferably, the redox potential of the etch composition is in the range of about −0.5 to about +0.7 or higher (vs. Standard Hydrogen Electrode (SHE)). As used herein, the redox potential is a measure of the effectiveness of the etch composition as an oxidizing agent, i.e., the ability of the etch composition to oxidize silicon for removal by the HF component of the etch composition.

The above ranges for the buffered fluoride etch solution are particularly applicable to the use of ammonium fluoride and hydrogen peroxide but appear to be equally applicable to buffered fluoride etch compositions having other combinations of components as described above, such as when ammonium fluoride is provided by ammonium hydroxide and hydrofluoric acid. In other words, suitable amounts of ammonium hydroxide and hydrofluoric acid may be mixed to provide an adequate amount of ammonium fluoride. When ozone is used as the oxidizing agent, ozone is preferably present in a range of about 1 part per million (ppm) to about 50 ppm.

The buffered fluoride etch solution may exhibit an etch rate of silicon that is greater than three times the etch rate of an oxide being exposed to the same etch composition, i.e., the selectivity between silicon and oxide is greater than 3. More preferably, the selectivity between silicon and oxide using the etch composition is greater than 6 of oxide versus (100) silicon. Similarly, the buffered fluoride etch solution may exhibit $Si_3N_4$ selectivity for (110) silicon between about 10 to 80.

Further, to achieve desired throughput of wafers, the etch rate for silicon using the etch composition is preferably greater than about 150 Å/minute if the etch rate selectivity can be maintained. An etch rate that is too slow or too fast may result in a non-uniform end product.

Preferably, the etch composition is such that after removal of silicon using the etch composition the silicon surface has a desired surface roughness adequate for later processing. Preferably, the roughness of the silicon surface following the etch is within the range of about 1.25 Å RMS to about 1.30 Å RMS. The silicon surface may desirably fall within such a range for roughness after more than 180 Å of silicon is removed. Generally, for example, RMS roughness may be determined by Atomic Force Microscopy (AFM), which scans a surface area of about 1 $\mu m^2$ and gives an average peak-to-valley measurement across this 1 $\mu m^2$ surface area.

Preferably, the high selectivity to oxide as described above is a high selectivity to thermal oxide. For example, such thermal oxide may be formed by thermal oxidation such as with use of a wet or dry furnace oxidation. However, such selectivity is also applicable to oxides formed by chemical vapor deposition (CVD), such as high-density plasma oxide typically used in isolation processes, such as shallow trench isolation.

Generally, any known method may be used to expose the single crystal silicon to the selected etchant. For example, the silicon may be immersed into a tank of the etch solution. The solution may also be sprayed onto the wafers being etched or may be introduced for contact with the wafer in any other manner, e.g., drip, spraying, vapor, etc. The etching process may be performed at a temperature in the range of about 10° C. to about 90° C. Preferably, the etching process occurs at a temperature between 10° C. to about 30° C. and, more preferably, between about 22° C. and 25° C.

Referring to FIGS. 5A and 5B, a single crystal silicon 10 undercut was performed in both the standard silicon orientation (i.e., patterned along the <110> direction) and 45° rotation in (100) silicon using a buffered fluoride etch solution (10 L $NH_4F$+5 L QEII+7.5 L $H_2O_2$) at 26° C. according to the present invention. The buffered fluoride etch solution used in FIG. 5A demonstrates that the (100) silicon planes is the slow etching planes taht allows the creation of square undercuts if the pattern is aligned along the <100> direction. In a typical hydroxide-based etch, the (111) plane is a slow etch; thus, it was surprising to discover a wet etch with a slow plane etch in (100) silicon.

Figure 18:
FIG. 18 is a transmission electron micrograph ("TEM") of a shelf created by a method of the present invention under an integrated DRAM access transistor largely following the method depicted in FIGS. 17A-17I.

The buffered fluoride etch solution provides good selectivity, smooth surfaces and controllable etching of (100) silicon. Referring to FIG. 5B, the lateral shelf 14 and lack of beveled corners enable the easy creation thereon of electrical devices such as FinFETs, Pseudo-SOI or RAD bowls in conventional CMOS wafers that are manufactured on (100) silicon. FIG. 18 is a TEM of a silicon shelf built under a transistor following the method described in association with FIGS. 17A-17I. The use of the buffered fluoride etch solution also creates concave square corners without a lateral spacer, which is desirable for electronic properties in silicon fingers of sheets that have very different properties from the adjacent material having no material etched. The concave square corners depicted in FIG. 3C may also be useful for a discrete change in device mechanical and optical properties when fabricating MEMS. The concave corner in (100) silicon also allows simple integration in CMOS devices and enables MEMS mechanical and optical structures to be integrated with CMOS processing more easily.

The etch rate and selectivity of the buffered fluoride etch solution depends on two competing mechanisms—the oxidation of silicon and the etch rate of oxide. This may be depicted in the following simplified reactions:

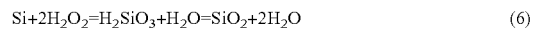

$$Si+2H_2O_2=H_2SiO_3+H_2O=SiO_2+2H_2O \qquad (6)$$

Half-cell reduction/oxidation reactions:

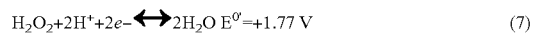

$$H_2O_2+2H^++2e- \longleftrightarrow 2H_2O \; E^{0'}=+1.77\,V \qquad (7)$$

$$Si_s+2OH^- \longleftrightarrow =Si(OH)_2+2e^- \qquad (8)$$

$$H_2SiO_3+6HF \longleftrightarrow H_2SiF_6+3H_2O \qquad (9)$$

The typical selectivity between (100) silicon crystal orientation and thermal oxide is approximately 6 using $NH_4F$, QEII and $H_2O_2$ (provided in a ratio of 4:2:3) while the etchant selectivity of 100:1 deionized water:TMAH is approximately or larger than 1000. The <110> directional etch is approximately two and one half times higher than (100) silicon etch.

Figure 6A:
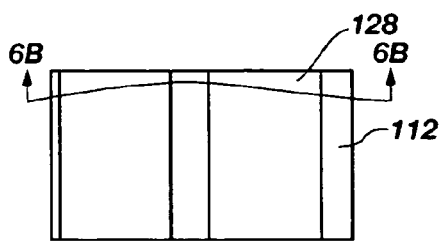
Figure 6B:
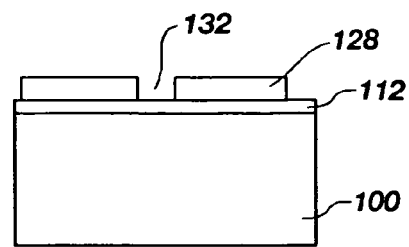
FIG. 6B is a cross-sectional view of the same single crystal silicon wafer taken along line 6B-6B of FIG. 6A.

Although the buffered fluoride etch solution may be used in various applications, FIGS. 6A-13D depict a partial process for creating a pseudo-SOI structure according to a method of the present invention. In each of FIGS. 6A-13D, part A shows a plan view of the structure and part B shows a cross-sectional view of the corresponding structure taken along B-B. FIGS. 6A and 6B depict a single crystal silicon substrate 100. A silicon nitride liner 112 is formed thereover. A masking layer 128, for example, photoresist, is formed over the silicon nitride liner 112 as known in the art. The masking layer 128 may be patterned to form at least one trench mask opening 132. Conventional photolithography or other lithographic or non-lithographic methods, regardless of the presence of the masking layer 128, are also contemplated.

Figure 7A:
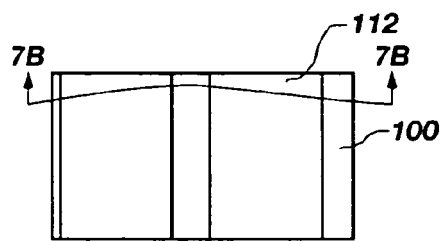
FIG. 7A is a plan view of a single crystal silicon wafer according to an embodiment of the present invention.
Figure 7B:
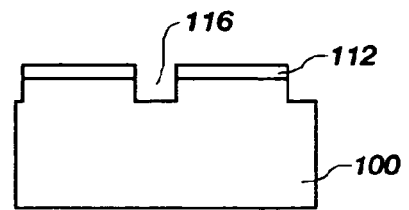
FIG. 7B is a cross-sectional view of the same single crystal silicon wafer taken along line 7B-7B of FIG. 7A.

Referring to FIGS. 7A and 7B, the silicon nitride liner 112 and single crystal silicon substrate 100 are etched through the mask opening 132 to form at least one trench 116 within the single crystal silicon substrate 100. The etch may be conducted utilizing a dry anisotropic etching chemistry, with or without plasma, for example, comprising ammonia and at least one fluorocarbon. Masking layer 128 may remain or may be removed when etching into the single crystal silicon substrate 100. While a specific method of forming trench 116 has been disclosed, it will be understood by one of skill in the art that any method of forming trench 116 may be utilized.

Figure 8A:
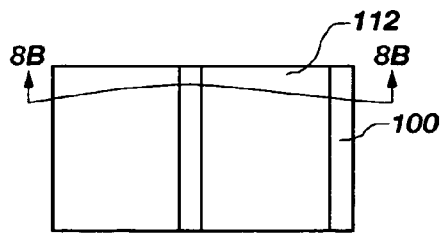
FIG. 8A is a plan view of a single crystal silicon wafer according to an embodiment of the present invention.
Figure 8B:
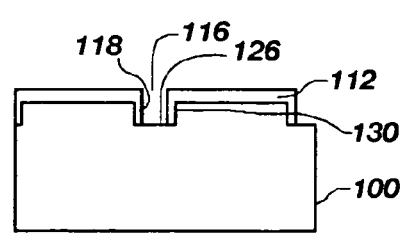
FIG. 8B is a cross-sectional view of the same single crystal silicon wafer taken along line 8B-8B of FIG. 8A.

Referring to FIGS. 8A and 8B, a nitride layer may be deposited over the silicon nitride liner 112 and trench 116 followed by an etch taht removes the nitride from the bottom 126 of the trench 116, but creates nitride spacers 118 on the sidewalls 130 of trench 116. Creation of the Si$_3$N$_4$ liner may be performed by conventional techniques. Oxide spacers may also be used by TEOS deposition or SiO$_2$ growth as known in the art.

Figure 9A:
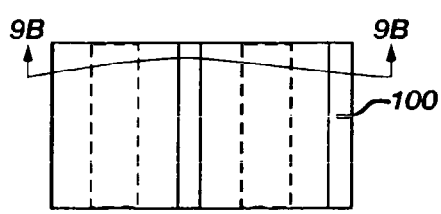
FIG. 9A is a plan view of a single crystal silicon wafer according to an embodiment of the present invention.
Figure 9B:
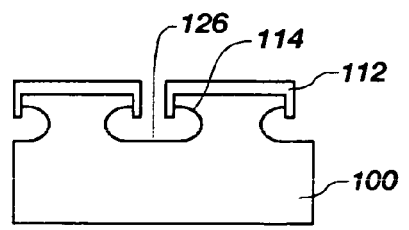
FIG. 9B is a cross-sectional view of the same single crystal silicon wafer taken along line 9B-9B of FIG. 9A.

The buffered fluoride etch solution of the present invention may then be applied to undercut the single crystal silicon substrate 100. Preferably, the buffered fluoride etch solution may be applied at approximately 23° C. for approximately 5 minutes, depending on the desired size of the lateral shelf 114. As shown in FIGS. 9A and 9B, the buffered fluoride etch solution etches faster in a direction parallel to the single crystal silicon substrate 100 as compared with the vertical etch through the bottom 126 of the trench 116. A lateral shelf 114 having a thickness of approximately 450 Å to 550 Å may be created as shown in FIG. 9B.

Figure 10A:
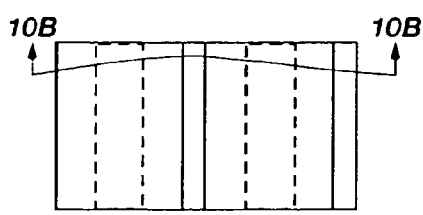
FIG. 10A is a plan view of a single crystal silicon wafer according to an embodiment of the present invention.
Figure 10B:
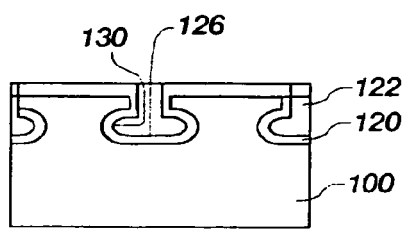
FIG. 10B is a cross-sectional view of the same single crystal silicon wafer taken along line 10B-10B of FIG. 10A.
Figure 11A:
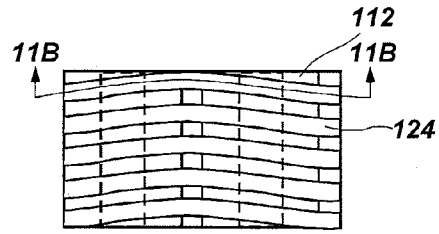
FIG. 11A is a plan view of a single crystal silicon wafer according to an embodiment of the present invention.
Figure 11B:
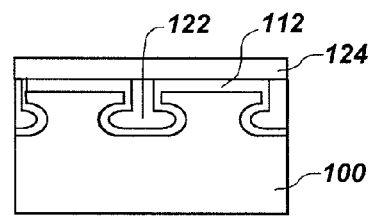
FIG. 11B is a cross-sectional view of the same single crystal silicon wafer taken along line 11B-11B of FIG. 11A.
Figure 12A:
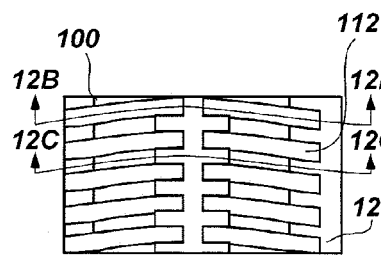
FIG. 12A is a plan view of a single crystal silicon wafer according to an embodiment of the present invention.
Figure 12B:
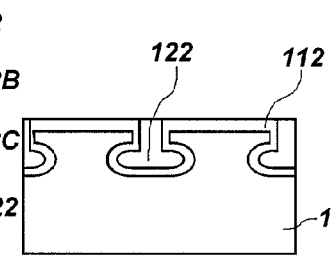
FIG. 12B is a cross-sectional view of the same single crystal silicon wafer taken along line 12B-12B of FIG. 12A.
Figure 12C:
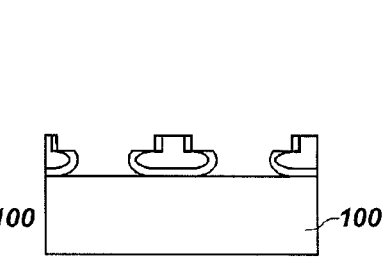
FIG. 12C is a cross-sectional view of the single crystal silicon wafer of FIG. 12A taken along line 12C-12C of FIG. 12A.

If desired, a nitride liner 120 may be deposited on the bottom 126 and sidewalls 130 of the trench 116 and then the trench 116 may be filled with an oxide material 122, for example, an SOD as shown in FIGS. 10A and 10B.

A mask 124 is deposited and patterned over the silicon nitride liner 112 and oxide material 122. A conventional silicon etch having some selectivity to oxide may be performed as shown in FIGS. 11A, 11B, and 12A-12C.

An optional nitride liner 136 may be deposited and an SOD fill may be performed as shown in FIGS. 13A-13D. After the SOD fill depicted in FIGS. 13A-13D, the structure 150 may be subjected to further processing to form, for example, transistors, capacitors and digit lines thereover to complete the pseudo-SOI structure. The structure 150 includes a lateral shelf 114 having a thickness of about 500 Å (+/−10%).

Figure 13A:
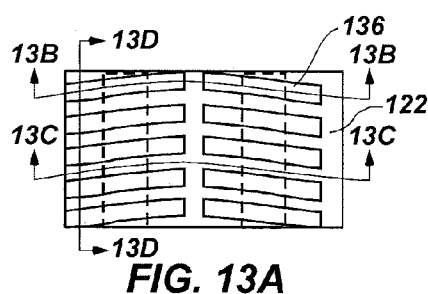
FIG. 13A is a plan view of a single crystal silicon wafer according to an embodiment of the present invention.
Figure 13B:
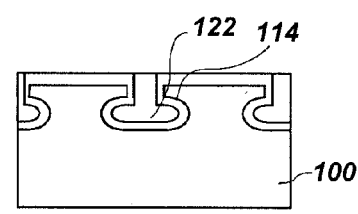
FIG. 13B is a cross-sectional view of the same single crystal silicon wafer taken along line 13B-13B of FIG. 13A.
Figure 13C:
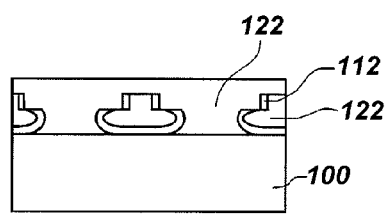
FIG. 13C is a cross-sectional view of the single crystal silicon wafer of FIG. 13A taken along line 13C-13C of FIG. 13A.
Figure 13D:
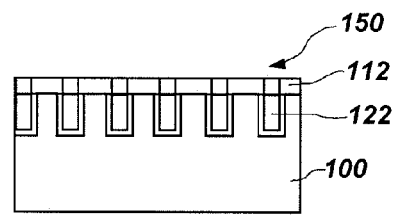

The resulting structure, including any transistors, such as ray transistors or access transistors, overlying structure 150 has significantly lower leakage due to the presence of oxide material 122 underlying the silicon (see, e.g., FIG. 13B). It will be understood that structure 150 is not limited to being an intermediate pseudo-SOI structure. Any number of additional fabrication steps may be performed in conjunction with the present invention to create any desired device.

Figure 14A:
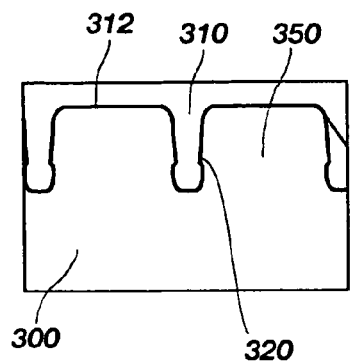
FIGS. 14A-14E show a progressive undercut etch of single crystal silicon using a buffered fluoride etch solution of the present invention. The top surface of the single crystal silicon represents the (100) plane. The trench is <110> on the (100) plane.
Figure 14B:
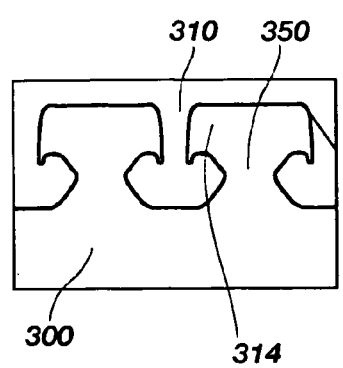
Figure 14C:
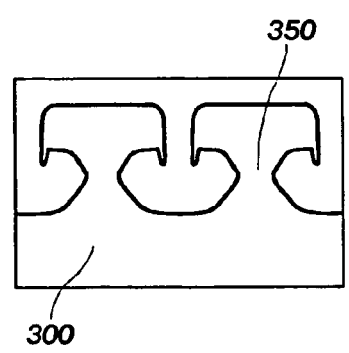
Figure 14D:
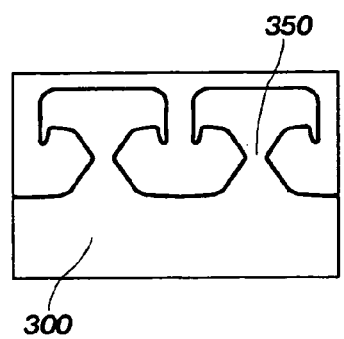
Figure 14E:
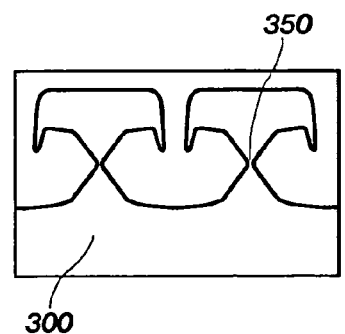
Figure 15A:
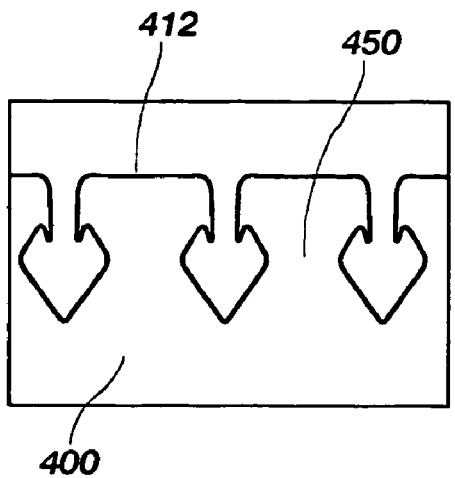
FIGS. 15A-15D show a progressive undercut etch of single crystal silicon using a buffered fluoride etch solution of the present invention after exposure to $NH_4OH$. The top surface of the single crystal silicon represents the (100) plane. The trench is <110> on the (100) plane.
Figure 15B:
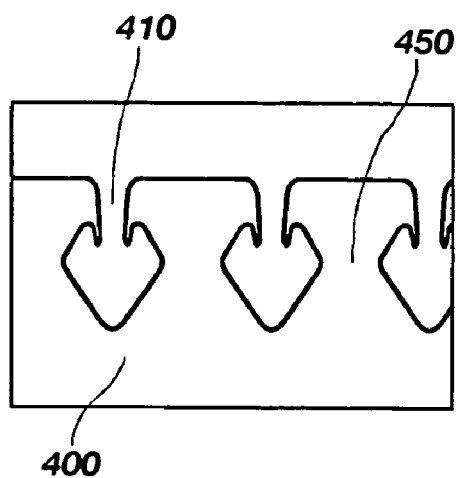
Figure 15C:
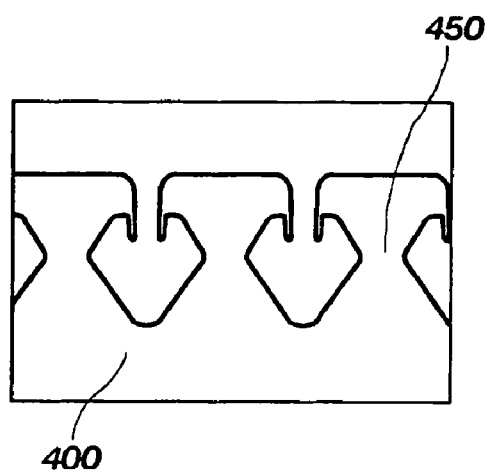
Figure 15D:
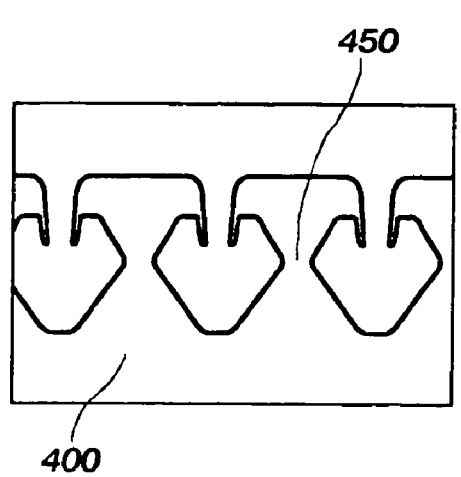

FIGS. 14A-14E depict silicon oxidation and etching by immersion at 23° C. using a solution including NH$_4$F, QEII and H$_2$O$_2$ (provided in a ratio of 4:2:3 by volume). FIG. 14A depicts a trench 310 in single crystal silicon 300 with a nitride liner 320 prior to addition of the buffered fluoride etch solution of the present invention. The top surface 312 of the single crystal silicon 300 represents the (100) plane. The trench 310 is <110> on the (100) plane. After 16 minutes of exposure to the buffered fluoride etch solution at approximately 23° C., an undercut profile is visible having a lateral shelf 314 (FIG. 14B). The etch is progressing faster perpendicular to the (100) direction (i.e., perpendicular to the STI sidewall), than in the (100) direction (i.e., perpendicular to the wafer surface) as shown in FIGS. 14C-14E after 22 minutes, 25 minutes and 28 minutes exposure, respectively. As seen in FIGS. 14C-14E, the width of the underlying silicon leg, or pillar, 350 decreases with increased exposure to the buffered fluoride etch solution.

The buffered fluoride etch solution may be combined with other components in combination with pattern angles to manufacture vertical walls in various ways. FIGS. 15A-15D depict the etch progression of single crystal silicon 400 at 0 minutes (FIG. 15A), 3 min (FIG. 15B), 6 min (FIG. 15C) and 9 min (FIG. 15D) exposure by immersion to the buffered fluoride etch solution after a five-minute anisotropic NH$_4$OH etch at 23° C. The top surface 412 of the single crystal silicon 400 represents the (100) plane. The trench 410 is <110> on the (100) plane. Increasing the time of the buffered fluoride etch solution etch forms a shelf undercut of the silicon active area without significantly increasing the trench depth. Further, it can be seen that the silicon legs, or pillars, 450 under the single crystal silicon 400 become increasingly narrow as the etch progresses. Thus, it will be understood that using appropriate pattern angles in combination with etchant solutions of the present invention, devices may be manufactured having various characteristics. By manipulating the etch time and etchant combination, different undercut profiles may be achieved. For example, the buffered fluoride etch solution may be sequentially combined with hydroxides, NH$_4$OH, NH$_4$F, TMAH or combinations thereof.

The present invention may be further understood by the following additional, non-limiting examples.

Example 8

A single crystal silicon wafer was etched with NH$_4$F, QEII and H$_2$O$_2$ (provided in a ratio of 4:2:3) for 5 minutes at 26° C. The silicon was patterned along the <100> direction. The etchant created a square undercut in the single crystal silicon wafer.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the etch compositions described herein. Various modifications of the illustrative embodiments, as well as additional embodiments of the invention, will be apparent to persons skilled in the art upon reference to this description. While the preferred embodiments of the present invention have been described herein, the invention defined by the claims herein is not limited by particular details set forth in the above description, as many apparent variations thereof are possible without departing from the spirit or scope thereof.

What is claimed is:

1. A method of forming isolated single crystal silicon islands, the method comprising:
    forming a plurality of trenches in a single crystal silicon substrate;
    forming a liner overlying an upper surface of the single crystal silicon substrate and extending at least partially into the trenches of the plurality;
    exposing the single crystal silicon substrate to an etchant solution to undercut the single crystal silicon substrate and create at least one silicon pillar extending perpendicularly between a surface of the single crystal silicon substrate and a base of a silicon structure defined by beveled edges and having an outer perimeter laterally extending beyond an outer perimeter of the at least one silicon pillar; and
    removing the at least one silicon pillar.

2. The method of claim 1, wherein forming a plurality of trenches in a single crystal silicon substrate comprises forming a plurality of shallow trench isolation structures in the single crystal silicon substrate.

3. The method of claim 1, wherein exposing the single crystal silicon substrate to an etchant solution comprises exposing the single crystal silicon substrate to an anisotropic etchant solution selected from the group consisting of tetramethylammonium hydroxide, buffered oxide etch, tetramethylammonium hydroxide and ammonium fluoride, tetramethylammonium hydroxide and a fluoride component, ammonium hydroxide and ammonium hydroxide and ammonium fluoride.

4. The method of claim 1, further comprising performing a dry etch of the single crystal silicon substrate after forming the liner and before exposing the single crystal silicon substrate to the etchant solution.

5. The method of claim 1, wherein removing the at least one silicon pillar comprises:
performing a spin-on-dielectric fill of the plurality of trenchs after the exposing;
oxidizing the spin-on-dielectric fill; and
performing steam densification to remove the at least one silicon pillar.

6. The method of claim 1, wherein forming a liner comprises forming a silicon nitride liner overlying the single crystal silicon substrate and extending at least partially into the plurality of trenches therein.

7. The method of claim 1, wherein forming a liner comprises forming the liner over the upper surface of the single crystal silicon substrate and removing the liner from a bottom surface of the trenches of the plurality and partially removing the liner from sidewalls of the trenches of the plurality.

8. The method of claim 7, further comprising patterning the liner and performing a dry etch to remove portions of the liner.

9. The method of claim 1, wherein exposing the single crystal silicon substrate to an etchant solution comprises exposing the single crystal silicon substrate to an etchant solution including an oxidizing agent, an inorganic acid, and a hydroxide or a fluoride component, or an oxidizing agent, an inorganic acid, and both a hydroxide and a fluoride component.

10. The method of claim 9, further comprising selecting the fluoride component from the group consisting of hydrogen fluoride, ammonium fluoride and tetramethylammonium fluoride.

11. The method of claim 9, further comprising selecting the fluoride component to be ammonium fluoride formed from ammonium hydroxide and hydrofluoric acid.

12. The method of claim 9, further comprising selecting the inorganic acid from the group consisting of hydrofluoric acid, phosphoric acid, sulfuric acid, nitric acid, hydrochloric acid and carbonic acid.

13. The method of claim 9, further comprising selecting the oxidizing agent from the group consisting of hydrogen peroxide and ozone.

14. The method of claim 1, wherein exposing the single crystal silicon substrate to an etchant solution comprises immersing the single crystal silicon substrate in a bath comprising a fluoride component, an oxidizing agent and an inorganic acid.

15. The method of claim 14, further comprising immersing the single crystal silicon substrate in a bath including $NH_4F$, a solution comprising HF, $H_3PO_4$, and $NH_4F$, and $H_2O_2$ in a volumetric ratio of about 4:2:3.

16. The method of claim 14, further comprising immersing the single crystal silicon substrate in a bath including approximately 10-35 w % $NH_4F$, approximately 3-20 w % $H_2O_2$, approximately 0.1-2 w % $H_3PO_4$ or other acid, and approximately 43-86.9 w % deionized water.

17. A method of forming vertical single crystal silicon walls, the method comprising:
forming a plurality of trenches in a single crystal silicon substrate;
forming a liner over unrecessed portions of the single crystal silicon substrate and extending only partially onto sidewalls of the trenches of the plurality;
anisotropically etching regions of the single crystal silicon substrate exposed within the trenches of the plurality to create at least one vertical single crystal silicon structure defined by square corners; and
removing the liner.

18. The method of claim 17, wherein anisotropically etching regions of the single crystal silicon substrate exposed within the trenches of the plurality comprises exposing the single crystal silicon substrate to an anisotropic etchant selected from the group consisting of tetramethylammonium hydroxide, buffered oxide etch, tetramethylammonium hydroxide and ammonium fluoride, tetramethylammonium hydroxide and a fluoride component, ammonium hydroxide and ammonium hydroxide and ammonium fluoride.

19. The method of claim 17, wherein anisotropically etching regions of the single crystal silicon substrate exposed within the trenches of the plurality comprises undercutting the single crystal silicon substrate by exposing the single crystal silicon substrate to the anisotropic etch for approximately 2 to 10 minutes at approximately 20° C. to 30° C.

20. The method of claim 17, wherein anisotropically etching regions of the single crystal silicon substrate exposed within the trenches of the plurality comprises exposing the single crystal silicon substrate to an etchant solution including a fluoride component, an oxidizing agent and an inorganic acid.

21. The method of claim 20, further comprising selecting the fluoride component from the group consisting of hydrogen fluoride, ammonium fluoride and tetramethylammonium fluoride.

22. The method of claim 20, further comprising selecting the fluoride component to be ammonium fluoride formed from ammonium and hydrofluoric acid.

23. The method of claim 20, further comprising selecting the inorganic acid from the group consisting of hydrofluoric acid, phosphoric acid, sulfuric acid, nitric acid, hydrochloric acid and carbonic acid.

24. The method of claim 20, further comprising selecting the oxidizing agent from the group consisting of hydrogen peroxide and ozone.

25. The method of claim 20, further comprising undercutting the single crystal silicon substrate by exposing the single crystal silicon substrate to the etchant solution at a temperature of about 10° C. to about 90° C.

26. The method of claim 17, wherein anisotropically etching regions of the single crystal silicon substrate exposed within the trenches of the plurality comprises immersing the single crystal silicon substrate in a bath including a fluoride component, an oxidizing agent and an inorganic acid.

27. The method of claim 26, wherein anisotropically etching comprises immersing the single crystal silicon substrate in a bath including $NH_4F$, a solution comprising $NH_4F$, $H_3PO_4$, and HF, and $H_2O_2$ in a volumetric ratio of about 4:2:3.

28. The method of claim 26, further comprising immersing the single crystal silicon substrate in a bath including approximately 10-35 w % $NH_4F$, approximately 3-20 w % $H_2O_2$, approximately 0.1-2 w % $H_3PO_4$ or other acid, and approximately 43-86.9 w % deionized water.

29. The method of claim 17, wherein anisotropically etching regions of the single crystal silicon substrate exposed within the trenches of the plurality comprises exposing the single crystal silicon substrate to a solution including a fluoride component, an oxidizing agent and an inorganic acid, wherein the solution includes a pH of about 5.8 to about 9.8.

30. A method of creating an undercut structure on single crystal silicon, the method comprising:
providing single crystal silicon having a first via with a first sidewall proximate a second via, the second via with a second sidewall proximate the first via;

forming a liner overlying an upper surface of the single crystal silicon and extending at least partially onto the first and second sidewalls;

anisotropically etching the first sidewall and the second sidewall until a portion of the first sidewall and a portion of the second sidewall merge to form a cavity within the single crystal silicon defined by beveled sidewalls.

31. The method of claim 30, further comprising providing the liner only on an upper portion of the first sidewall and the second sidewall.

32. The method of claim 31, wherein forming a liner comprises forming a liner on the first sidewall and the second sidewall, each having a length corresponding to a thickness of a perimeter ledge formed from the single crystal silicon after anisotropically etching.

33. The method of claim 30, wherein anisotropically etching the first sidewall and the second sidewall comprises performing at least two anisotropic etches.

34. The method of claim 31, wherein anisotropically etching the first sidewall and the second sidewall comprises performing a first etch with a first crystal plane selectivity and performing a second etch with a second crystal plane selectivity.

35. A method of shaping an undercut structure in single crystal silicon, the method comprising:

creating a first via and a second via proximate the first via in single crystal silicon;

performing an etch with an etchant including a hydroxide; and performing an etch with an anisotropic wet etchant solution comprising $NH_4F$, a solution comprising $NH_4F$, $H_3PO_4$, and HF, and $H_2O_2$ in a volumetric ratio of about 4:2:3 to form an undercut defined by beveled edges in the single crystal silicon.

* * * * *

UNITED STATES PATENT AND TRADEMARK OFFICE
CERTIFICATE OF CORRECTION

PATENT NO. : 7,709,341 B2  Page 1 of 1
APPLICATION NO. : 11/445544
DATED : May 4, 2010
INVENTOR(S) : Janos Fucsko et al.

It is certified that error appears in the above-identified patent and that said Letters Patent is hereby corrected as shown below:

In column 14, line 66, in Claim 3, after "ammonium hydroxide" delete "and ammonium hydroxide".

In column 15, line 8, in Claim 5, delete "trenchs" and insert -- trenches --, therefor.

In column 16, line 12, in Claim 18, after "ammonium hydroxide" delete "and ammonium hydroxide".

Signed and Sealed this

Twentieth Day of July, 2010

David J. Kappos
*Director of the United States Patent and Trademark Office*